United States Patent
Chow et al.

(10) Patent No.: US 10,551,462 B2
(45) Date of Patent: Feb. 4, 2020

(54) ACCURACY AND OFF-RESONANCE PERFORMANCE IN QUANTITATIVE MAGNETIZATION PREPARED MAGNETIC RESONANCE IMAGING

(71) Applicants: Siemens Healthcare GmbH, Erlangen (DE); The Governors of the University of Alberta, Edmonton (CA)

(72) Inventors: Kelvin Chow, Edmonton (CA); Richard Thompson, Edmonton (CA); Bruce S. Spottiswoode, Chicago, IL (US)

(73) Assignees: Siemens Healthcare GmbH, Erlangen (DE); The Governors of the University of Alberta, Edmonton (CA)

( * ) Notice: Subject to any disclaimer, the term of this patent is extended or adjusted under 35 U.S.C. 154(b) by 635 days.

(21) Appl. No.: 14/566,796

(22) Filed: Dec. 11, 2014

(65) Prior Publication Data

US 2015/0160320 A1 Jun. 11, 2015

Related U.S. Application Data

(60) Provisional application No. 61/914,455, filed on Dec. 11, 2013.

(51) Int. Cl.
*G01R 33/561* (2006.01)
*G01R 33/50* (2006.01)
*G01R 33/56* (2006.01)

(52) U.S. Cl.
CPC ......... *G01R 33/5614* (2013.01); *G01R 33/50* (2013.01); *G01R 33/5602* (2013.01)

(58) Field of Classification Search
USPC .................. 324/300–322; 600/407–435; 382/128–131
See application file for complete search history.

(56) References Cited

U.S. PATENT DOCUMENTS

| 4,521,733 | A | * | 6/1985 | Bottomley | ......... G01R 33/5615 |
| | | | | | 324/307 |
| H001968 | H | | 6/2001 | Bernstein | |
| 7,227,356 | B1 | | 6/2007 | Hariharan et al. | |
| 7,847,551 | B2 | * | 12/2010 | Park | ...................... G01R 33/54 |
| | | | | | 324/307 |
| 8,432,166 | B2 | | 4/2013 | Worters et al. | |

(Continued)

OTHER PUBLICATIONS

Deppe, et al., "Variable Flip Angle Schedules in bSSFP Imaging of Hyperpolarized Noble Gases", Magnetic Resonance in Medicine; 67:1656-1664 (2012).
Worters, et al., "Balanced SSFR Transient Imaging using Variable Flip Angles for a Predefined Signal Profile", Magnetic Resonance in Medicine; Nov. 2010; 64(5): 1404-1412.

(Continued)

*Primary Examiner* — Melissa J Koval
*Assistant Examiner* — Tiffany A Fetzner

(57) ABSTRACT

A method for performing magnetic resonance imaging with variable flip angle (VFA) readouts includes preparing longitudinal magnetization of a spin system associated with a subject to a target state, yielding a prepared longitudinal magnetization. The prepared longitudinal magnetization is converted to an image using a VFA readout sequence, wherein the VFA readout sequence comprises a plurality of radio-frequency pulses with corresponding flip-angles varying according to a modulation function.

19 Claims, 8 Drawing Sheets

(56) References Cited

U.S. PATENT DOCUMENTS

| | | | | |
|---|---|---|---|---|
| 8,581,583 | B2* | 11/2013 | Greiser | A61B 5/055 324/307 |
| 9,625,548 | B2* | 4/2017 | Wasserman | G01R 33/4806 |
| 10,073,159 | B2* | 9/2018 | Kurokawa | G01R 33/5617 |
| 10,180,481 | B2* | 1/2019 | Srinivasan | G01R 33/482 |
| 2010/0013479 | A1* | 1/2010 | Park | G01R 33/54 324/309 |
| 2011/0210732 | A1* | 9/2011 | Worters | G01R 33/5614 324/309 |
| 2012/0119737 | A1* | 5/2012 | Jellus | G01R 33/561 324/309 |
| 2013/0141096 | A1* | 6/2013 | Bottomley | G01R 33/50 324/309 |
| 2013/0314086 | A1* | 11/2013 | Li | G01R 33/56509 324/309 |
| 2013/0335083 | A1* | 12/2013 | Wasserman | G01R 33/4806 324/309 |
| 2014/0084918 | A1* | 3/2014 | Kurokawa | G01R 33/5617 324/307 |
| 2015/0160320 | A1* | 6/2015 | Chow | G01R 33/5614 324/309 |

OTHER PUBLICATIONS

Mugler III, et al., "Shaping the Signal Response during the Approach to Steady State in Three-Dimensional Magnetization-Prepared Rapid Gradient-Echo Imaging Using Variable Flip Angles", Magnetic Resonance in Medicine 28, 165-185 (1992).

Chow, et al., "Saturation Recovery Single-Shot Acquistion (SASHA) for Myocardial T1 Mapping", Magnetic Resonance in Medicine 71:2082-2095 (2014).

Messroghli, et al., "Modified Look-Locker Inversion Recovery (MOLLI) for High-Resolutions T1 Mapping of the Heart", Magnetic Resonance in Medicine 52:141-146 (2004).

Kellman, et al., "Precision in T1-mapping and estimation of quality maps", Proc. Intl. Soc. Mag. Reson. Med. 21 (2013), 1 page.

Chow, et al., "Improved precision in SASHA T1 mapping with a variable flip angle readout", Journal of Cardiovascular Magnetic Resonance 2014, 16(Suppl 1):M9, pp. 1-2.

Giri, et al., "T2 quantification for improved detection of myocardial edema", Journal of Cardiovascular Magnetic Resonance 2009, 11:56, pp. 1-13.

Kellman, et al., "Imaging Sequences for First Pass Perfusion—A Review", Journal of Cardiovascular Magnetic Resonance (2007) 9, 525-537.

* cited by examiner

ACCURACY AND OFF-RESONANCE PERFORMANCE IN QUANTITATIVE MAGNETIZATION PREPARED MAGNETIC RESONANCE IMAGING

CROSS-REFERENCE TO RELATED APPLICATIONS

This application claims priority to U.S. provisional application Ser. No. 61/914,455 filed Dec. 11, 2013 which is incorporated herein by reference in its entirety.

TECHNICAL FIELD

The present invention relates generally to methods, systems, and apparatuses for quantitative magnetization prepared magnetic resonance imaging (MRI) applications using a variable flip angle readout scheme. The disclosed methods, systems, and apparatuses may be applied to various MRI clinical scenarios to improve the accuracy and off-resonance performance of the scan.

BACKGROUND

Magnetization prepared magnetic resonance imaging is a commonly used methodology whereby a combination of radio frequency (RF) pulses, gradient pulses, and temporal delays are used to prepare the longitudinal magnetization (Mz) of a spin system to a target state. The prepared longitudinal magnetization is converted to an image, in which the signal intensities are related to the starting Mz, using an imaging readout that comprises a train of RF pulses with constant flip angles. In quantitative magnetization prepared imaging, multiple magnetization prepared images are usually acquired using a systematically varied preparation scheme to result in prepared Mz that is a known function of the physical parameter of interest. The signal intensities from the resulting images can be fit to this function to determine the parameter of interest.

An underlying assumption made in quantitative magnetization prepared imaging is that the image signal intensity is directly proportional to the longitudinal magnetization prior to the imaging readout. Typical imaging comprises a series of RF pulses of constant flip angle, with single lines of k-space acquired sequentially between RF pulses. Image signal intensity is determined by the transverse magnetization when the center line of k-space is acquired, usually after numerous RF pulses when k-space is acquired linearly starting from the outer edge of k-space. While the transverse magnetization after the first imaging RF pulse is proportional to the starting Mz, subsequent acquisitions are not directly proportional due to cumulative effects of multiple preceding RF pulses and increased time for T1 relaxation. The magnitude of error in this relationship is affected by the flip angles and excitation phases of all preceding readout RF pulses, the patterns of gradients, as well as the relaxation properties of the spin system.

Imaging readouts may begin with a small number of "catalyzation" or "dummy" RF pulses that may have different flip angles from the rest of the imaging RF pulses and for which k-space data is not acquired. The primary purpose of these catalyzation pulses is to reduce oscillations in transverse magnetization during the subsequent constant flip angle train where k-space is acquired to reduce image artifacts.

Variable flip angle (VFA) readouts during the imaging RF train itself have been proposed to maximize the signal yield in hyperpolarized imaging experiments, to maintain constant transverse magnetization during imaging to reduce image blurring, or to optimize contrast between tissues with different relaxivities. In these approaches, a magnetization time-course is specified and a VFA scheme is designed to achieve it. For quantitative magnetization prepared imaging, VFA schemes should instead be formulated to improve the proportional relationship between the starting magnetization and the image signal intensity for a wide range of starting Mz and relaxation values.

Reduced flip angles can be used to lessen the effect of the RF pulses on the system's magnetization at the expense of reduced signal to noise or the desired image contrast. Therefore while a reduced, but still constant, flip angle readout may result in more accurate quantitative measurements, the loss of precision or image contrast may not be an acceptable tradeoff.

SUMMARY

Embodiments of the present invention address and overcome one or more of the above shortcomings and drawbacks by providing methods, systems, and apparatuses that utilize variable flip angle (VFA) readouts in quantitative magnetization-prepared imaging applications. The techniques described herein demonstrate that VFA imaging readouts can reduce system errors in quantitative magnetization prepared imaging while maintaining or improving signal-to-noise ratio.

According to some embodiments, a method for performing magnetic resonance imaging with variable flip angle (VFA) readouts includes preparing longitudinal magnetization of a spin system associated with a subject to a target state, yielding a prepared longitudinal magnetization. The prepared longitudinal magnetization is converted to an image using a VFA readout sequence, wherein the VFA readout sequence comprises a plurality of radio-frequency pulses with corresponding flip-angles varying according to a modulation function. In one embodiment, conversion of the prepared longitudinal magnetization to the image ignores a predetermined number of initial readouts from the VFA readout sequence.

Various modulation functions may be used with the aforementioned method. For example, in one embodiment, the modulation function is a partial sinusoid applied over the VFA readout sequence. In one embodiment, the method further comprises receiving an identification of a clinical application, selecting one or more desired image characteristics based on the clinical application; and identifying the modulation function based on those desired image characteristics.

The optimal VFA sequence length used in the aforementioned method may be selected based on one or more desired image characteristics. The VFA readout sequence may also be sized according to the optimal VFA sequence length. In some embodiments, an optimization process is performed over a plurality of iterations to identify the optimal VFA sequence length. This optimization process may, for example, compare a plurality of possible VFA readout sequences with varying lengths to a constant flip angle readout to identify the optimal VFA sequence length. The optimization process may also include determining a first signal-to-noise value associated with a constant flip-angle readout and identifying an optimal VFA readout sequence in the plurality of possible VFA readout sequences based on a comparison of the first signal-to-noise value to a plurality of second signal-to-noise values associated with the possible VFA readout sequences. The optimal VFA sequence length may then be based on the optimal VFA readout sequence. In some embodiments, the optimal VFA readout sequence is further identified based on factors such as, for example, blood tissue contrast or errors in T1 measurements in comparison to a dataset acquired using a constant flip angle sequence.

According to some embodiments, a second method for performing magnetic resonance imaging with variable flip angle (VFA) readout includes acquiring an initial image of an anatomical subject at an equilibrium magnetization using a VFA readout sequence and acquiring a plurality of additional images of the anatomical subject at variable rates of saturation recovery using the VFA readout sequence. This VFA readout sequence may be sized, for example, based on a center k-space line location. In one embodiment, a predetermined number of initial readouts are discarded from each respective VFA readout sequence during each acquisition. A curve fitting technique (e.g., a two-parameter T1 fitting model) is applied to reconstruct the initial image and the plurality of additional images into a single data set. Next, a T1 map of voxels is generated based on the single data set, wherein each voxel has a signal intensity representing T1 relaxation time of a corresponding portion of the anatomical subject.

In some embodiments of the aforementioned second method, the initial image and the plurality of additional images are acquired in a single breath-hold. Acquisition of the images may be triggered, for example, using an electrocardiogram signal. In some embodiments, the VFA readout sequence comprises a single-shot balanced steady-state free precession (bSSFP) readout sequence. This VFA readout sequence may include, for example, a plurality of radiofrequency pulses with corresponding flip-angles varying according to a modulation function.

According to other embodiments, a system for performing magnetic resonance imaging with variable flip angle (VFA) readouts includes an imaging device and a central computer unit. The imaging device includes a plurality of coils which are configured to acquire an initial image of an anatomical subject at an equilibrium magnetization using a VFA readout sequence and acquire a plurality of additional images of an anatomical subject at variable saturation recovery times using the VFA readout sequence. The central control computer unit is configured to apply a curve fitting technique to reconstruct the initial image and the plurality of additional images into a single data set. In some embodiments, the central control computer unit is further configured to generate a T1 map of voxels based on the single data set, wherein each voxel has a signal intensity representing T1 relaxation time of a corresponding portion of the anatomical subject.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION

The present invention relates generally to methods, systems, and apparatuses related to variable flip angle readout techniques for magnetization prepared magnetic resonance imaging (MRI) applications. Quantitative prepared MRI uses preparation of magnetization prior to the imaging readout for the purpose of encoding physical parameters of interest into the magnitude and phase of the prepared magnetization. This approach is subject to errors due to magnetization perturbation by the imaging readout itself. By varying the pattern of flip angle of the radiofrequency (RF) pulses used in the imaging readout, these errors can be minimized and the imaging readout can also be made less sensitive to off-resonance artifacts. The techniques described herein provide several potential benefits to MRI applications including, for example, (1) a reduction of image artifacts which leads to an improved reproducibility, (2) improved signal-to-noise ratio and precision, and (3) a reduction of the influence of readout which, in turn, may mitigate the loss in accuracy. These techniques may be applied to a variety of imaging sequences including, without limitation, single-shot balanced steady-state free precession (bSSFP) and Gradient Echo (GRE) imaging sequences.

Figure 1:
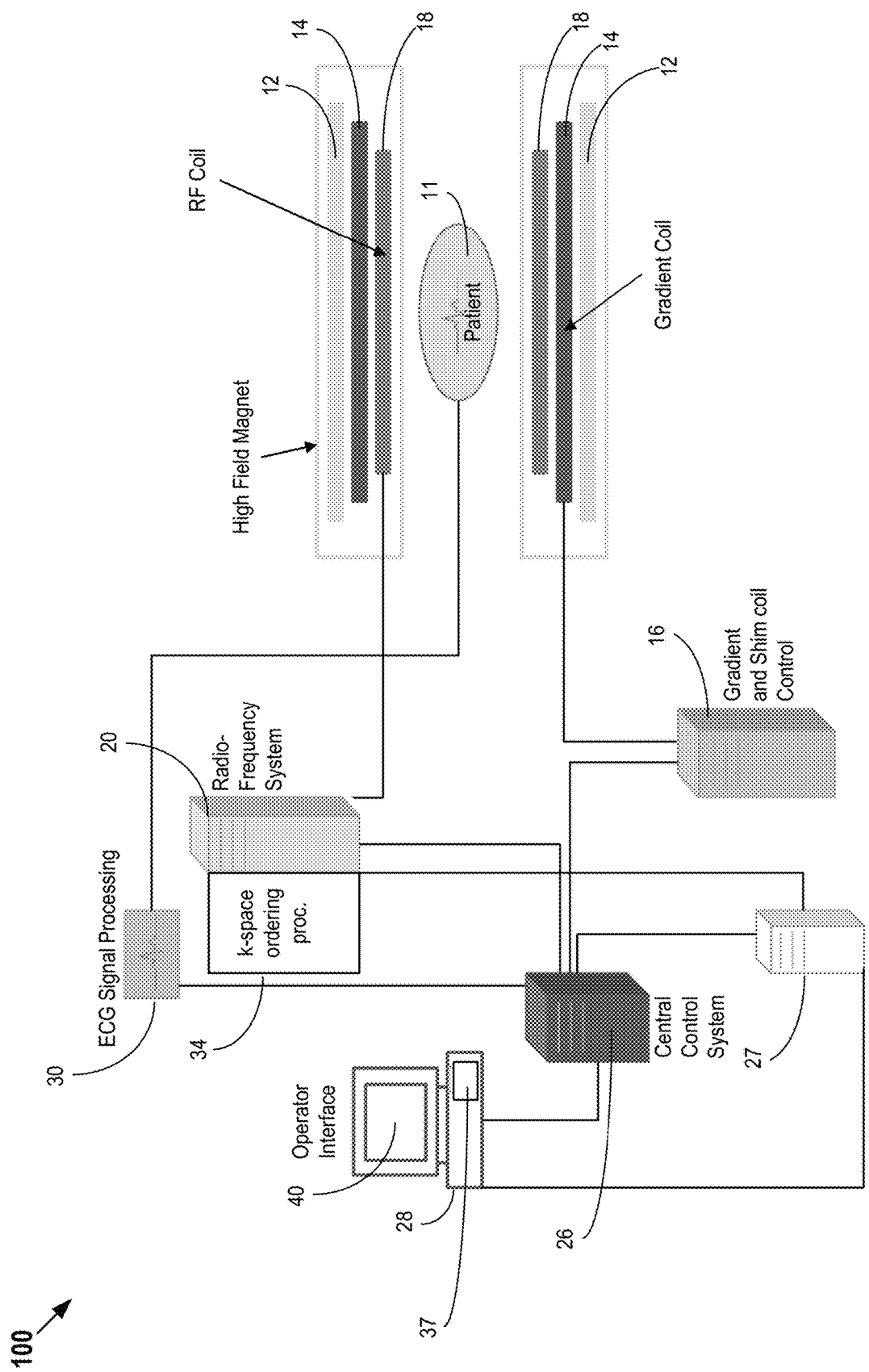
FIG. 1 shows a system for ordering acquisition of frequency domain components representing MR image data for storage in a k-space storage array, as used by some embodiments of the present invention.

FIG. 1 shows a system 100 for ordering acquisition of frequency domain components representing MR image data for storage in a k-space storage array, as used by some embodiments of the present invention. In system 100, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further RF (radio frequency) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11. For example, as described in greater detail below, in some embodiments, the central control unit 26 directs the various components of the system 100 to acquire radial k-space data using a bSSFP sequence with an interleaved-angle asymmetric radial sampling scheme.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide an MR dataset to an image data processor for processing into an image. In some embodiments, the image data processor is located in central control unit 26. However, in other embodiments such as the one depicted in FIG. 1, the image data processor is located in a separate unit 27. ECG synchronization signal generator 30 provides ECG signals used for pulse sequence and imaging synchronization. A two or three dimensional k-space storage array of individual data elements in k-space component processor unit 34 stores corresponding individual frequency components comprising an MR dataset. The k-space array of individual data elements has a designated center and individual data elements individually have a radius to the designated center.

A magnetic field generator (comprising coils 12, 14 and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components is sequentially acquired during acquisition of an MR dataset representing an MR image. A storage processor in the k-space component processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components is substantially minimized.

Central control unit 26 uses information stored in an internal database to process the detected MR signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control unit 26 and enables user modification of magnetic resonance imaging signals in substantially real time. Display processor 37 processes the magnetic resonance signals to provide image representative data for display on display 40, for example.

Using techniques described herein, the system 100 illustrated in FIG. 1 may be adapted to perform variable flip angle (VFA) readout techniques which provides improved accuracy and off-resonance performance in quantitative magnetization prepared MRI. To summarize, the longitudinal magnetization of a spin system associated with a subject is prepared to a target state. Various techniques may be used for magnetization preparation including, without limitation, preparation based on spatial location, chemical shift, magnetization transfer (MT), relaxation times (e.g. T1, T2, T1ρ, T2*), or motion and flow (e.g., diffusion). The technique may be matched to the application. For example, magnetization may be prepared with T1 contrast using a saturation pulse followed by a known delay. Once longitudinal magnetization is prepared, it is converted to an image using a VFA readout sequence. This VFA readout sequence includes a set of radio-frequency pulses with corresponding flip-angles varying according to a modulation function. The exact modulation function employed may vary and may be set, for example, based on desired image characteristics associated with the clinical application. For example, as discussed below, in some embodiments, the modulation function is a partial sinusoid applied over the VFA readout sequence. The length of the VFA sequence can also vary depending on factors such as the desired characteristics of the image. In some embodiments, an iterative optimization process is used to identify the optimal VFA sequence length, for example, by comparing possible VFA readout sequences with varying lengths to a constant flip angle readout to identify the optimal VFA sequence length. This comparison may be made based on factors such as, without limitation, signal-to-noise, blood tissue contrast, and errors in T1 measurements.

The proposed VFA techniques may be used as part of a SAturation-recovery single-SHot Acquisition (SASHA) sequence. The SASHA sequence is a quantitative magnetization prepared T1 mapping sequence with excellent accuracy independent of T1, T2, heart rate/sampling rate, and flip angle, which are known dependencies of the more commonly used MOdified Look-Locker Inversion-recovery (MOLLI) sequence. These methods take advantage of the good signal yield and blood-tissue contrast that is intrinsic of the single-shot balanced steady-state free precession (bSSFP) imaging readout sequence. However, the error in the proportional relationship between Mz and signal intensity due to the bSSFP readout results in a change in apparent saturation efficiency that is a function of the imaging readout parameters and relaxation rate constants. This change in the apparent saturation efficiency can be accounted for by using a three-parameter exponential recovery model but can result in T1 errors if a two-parameter model with assumed ideal saturation efficiency is used instead. VFA image readouts can be used with SASHA to minimize the effects of the image readout on the measured recovery curves. For example, the VFA image readout technique described herein allows the two-parameter T1 fitting method to be used with minimal systematic error, which significantly improves precision as compared to the three-parameter fit approach.

Figure 2A:
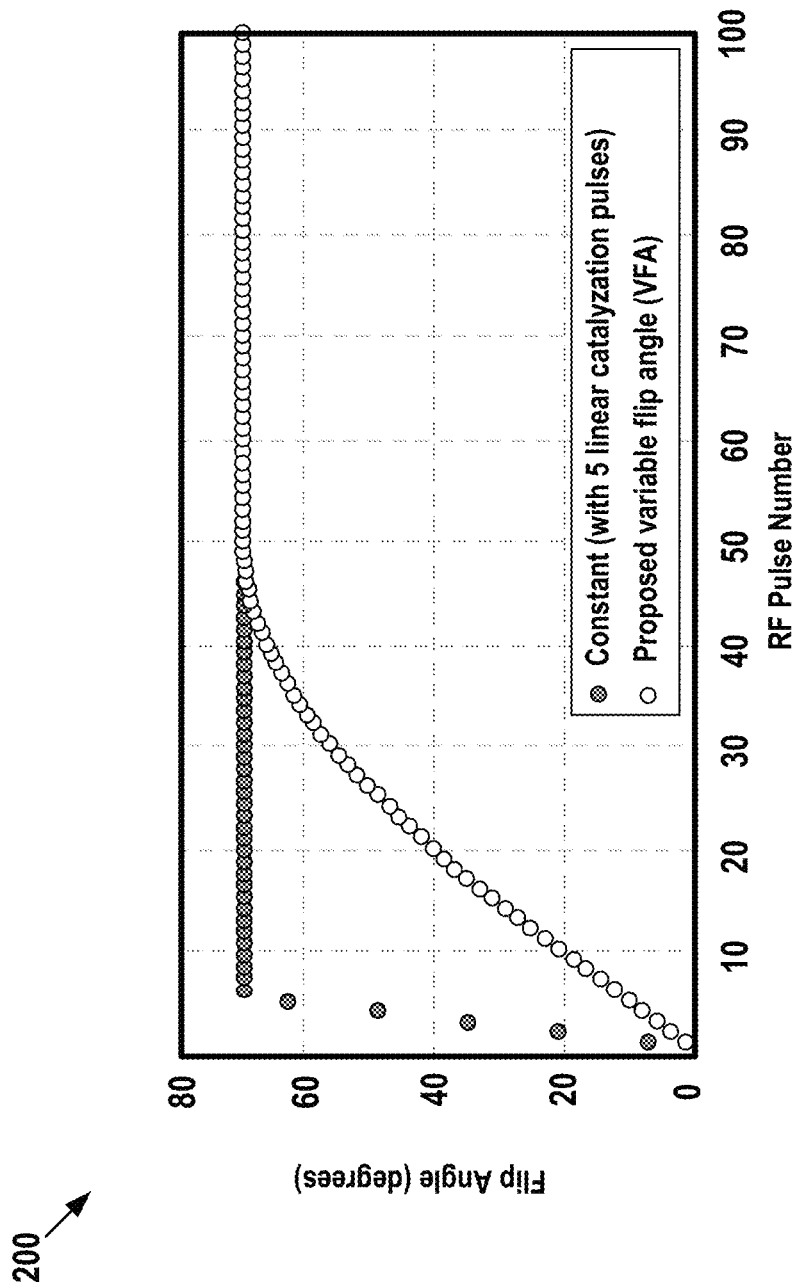
FIG. 2A shows a plot comparing a constant flip angle (CFA) scheme to a VFA scheme, as may be implemented according to some embodiments.

FIG. 2A shows a plot 200 comparing a constant flip angle (CFA) scheme to a VFA scheme, as may be implemented according to some embodiments. In this example, VFA length is 50. In some embodiments, the pattern may be empirically designed with Bloch equation simulations to minimize two-parameter fit errors with SASHA data. The modulation function used in the example of FIG. 2A is a partial sinusoid (from zero to the first peak) applied over a variable number of RF pulses to achieve a smooth transition to constant flip angle RF pulses, although a variety of other modulation functions could also be used in different embodiments. With a partial sinusoidal, the first n RF pulses in a sequence can be scaled by sin(x) where x is linearly spaced between for $\pi/2n < x < \pi/2$ and n is termed the VFA length. For example, in FIG. 2A, the prescribed flip angle is scaled for the first 50 pulses by sin(x) for $\pi/90 < x < \pi/2$. A typical constant flip angle readout with 5 catalyzation pulses is also shown for reference. For the proposed VFA approach, the first 5 data acquisitions in the pulse train may be discarded due to low signal, matching the number of dummy pulses with linear catalyzation in the standard constant flip angle readout.

Figure 2B:
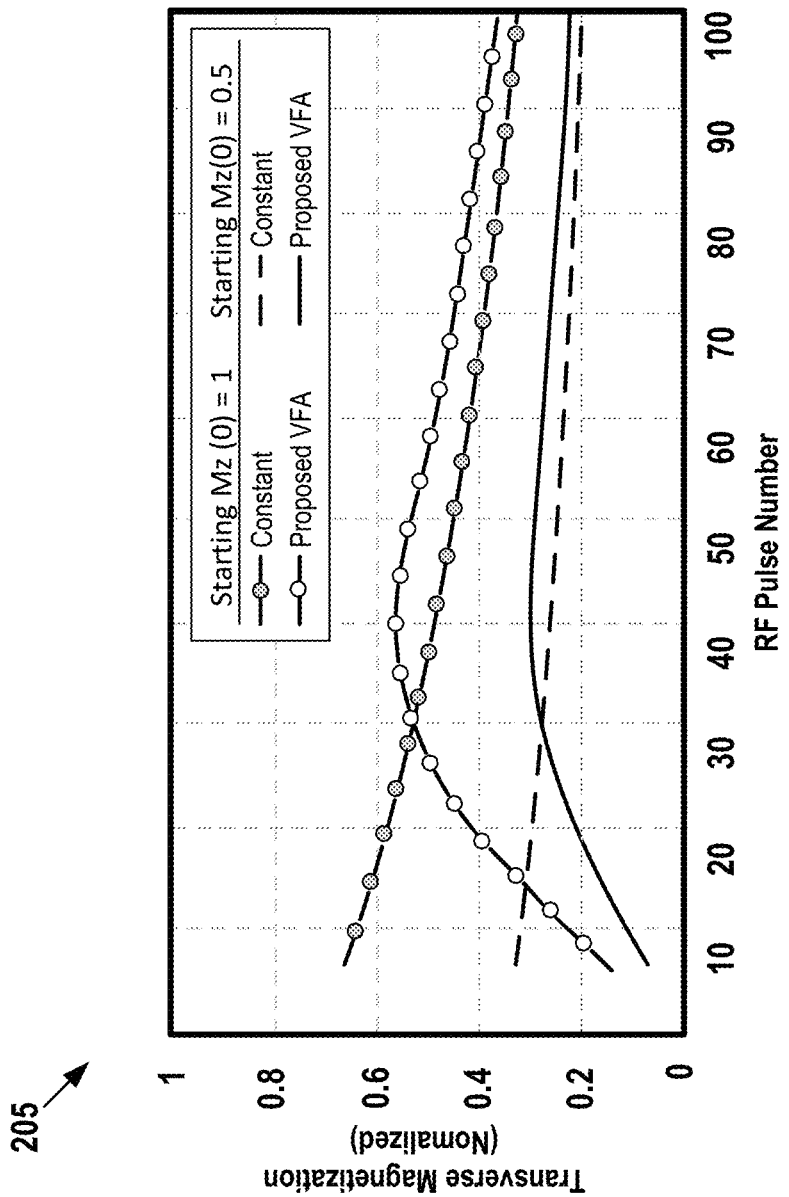
FIG. 2B provides a plot of normalized transverse magnetization versus pulse number showing the results from Bloch equation simulations during balanced steady-state free precession (bSSFP) imaging and comparing a CFA scheme to a VFA scheme, as may be implemented according to some embodiments.
Figure 2C:
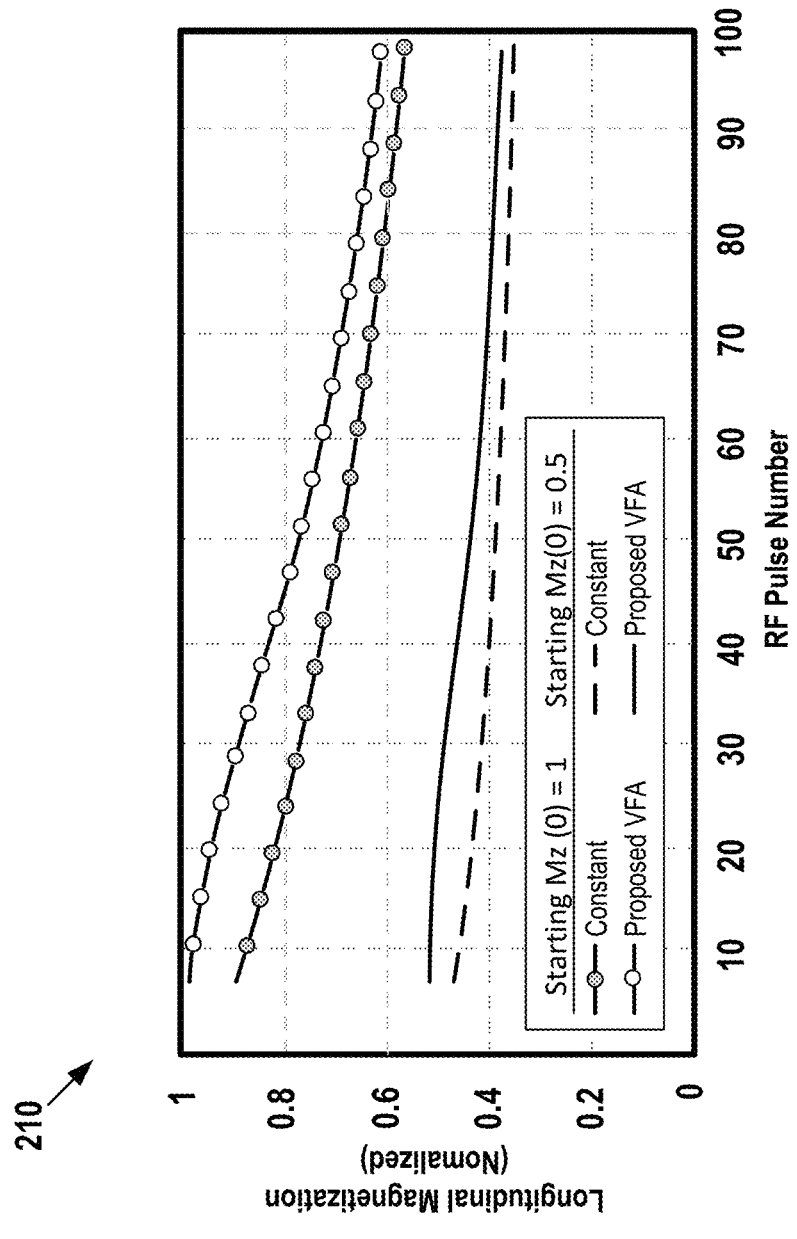
FIG. 2C provides a plot of normalized longitudinal magnetization versus pulse number showing the results from Bloch equation simulations during bSSFP imaging and comparing a CFA scheme to a VFA scheme, as may be implemented according to some embodiments.

FIGS. 2B and 2C show the results from Bloch equation simulations during bSSFP imaging with both readouts, for both full starting longitudinal magnetization ($M_Z(0)=1$), and half starting longitudinal magnetization ($M_Z(0)=0.5$). Specifically, FIG. 2B provides a plot 205 of normalized transverse magnetization versus pulse number, while FIG. 2C provides a plot 210 of normalized longitudinal magnetization versus pulse number. For this example, transverse magnetization is larger when using the VFA readout after the $30^{th}$ RF pulse, so images where the center of k-space is acquired after the $30^{th}$ line have greater signal-to-noise ratio than with a constant readout.

Using the techniques described herein, many different VFA schemes are possible with variations in parameters such as the number of RF pulses with altered flip angles and their pattern of modulations. In the examples illustrated of FIGS. 2A, 2B, and 2C, the pattern is a truncated sinusoid, so it has a smooth variation over the pulses. However, it should be noted that various patterns can be used with the design based on the clinical application. For example, the pattern may be selected based on pulse sequence used or the desired characteristics of the resultant image.

The error in calculated T1 values using a two-parameter model of SASHA with a constant flip angle readout increases when the center line of k-space is acquired later in the readout due to cumulative magnetization perturbations by the imaging RF pulses. In some embodiments, VFA scheme is optimized to take the location of the center line of k-space into consideration, such that the number of RF pulses with scaled flip angles is a function of the center k-space line. This allows the error to be minimized when the center line of k-space is acquired late (e.g. a higher resolution image with more k-space lines) while maintaining adequate signal-to-noise ratio when the center k-space line is acquired early (e.g. a lower resolution image with less k-space lines). For example, in some embodiments, the optimal number of varying RF pulses for SASHA may be determined based on Bloch equation simulations, yielding the following empirical formula for VFA length:

Number of VFA RF pulses=center k-space line*2.25−12.5

According to some embodiments, the process of selecting the optimal VFA length may incorporate various criterial based on the intended application or desired image characteristics. For example, the optimal VFA length may be selected with consideration of factors such as signal-to-noise ratio, blood-tissue contrast, as well as T1 error in native and/or post-contrast conditions. Additionally, different VFA lengths could be used for native and post-contrast imaging to obtain further benefits from the VFA readout. For example, increasing the VFA length could reduce the systematic errors in post-contrast blood T1 values, where shorter T1 values increase the signal intensity in the saturation recovery images and thus the reduced signal-to-noise ratio is less detrimental. For native (pre-contrast) imaging, the VFA length could be reduced to improve blood-tissue contrast and increase myocardial signal-to-noise ratio, thus reducing myocardial T1 variability at the expense of slightly larger T1 errors in native blood. Furthermore, the VFA optimization presented here considered only a sinusoid pattern with variable lengths in order to reduce the optimization complexity. Different VFA shapes including other smooth analytic functions or algorithmically calculated schemes may provide further benefits in, for example, signal-to-noise ratio, contrast, or T1 error. In some embodiments, an iterative optimization procedure is used to automate the process of selecting the optimal VFA length based on one or more user-selected criteria.

Figure 3A:
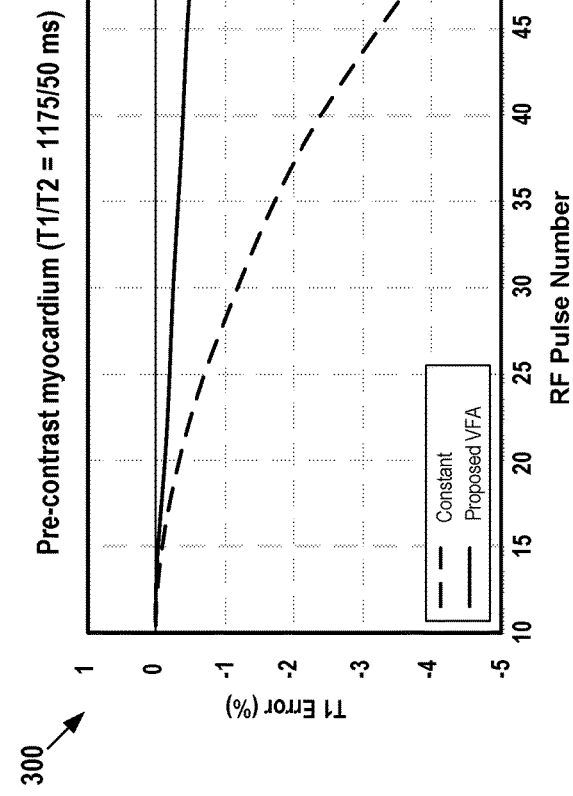
FIG. 3A includes a plot showing the error in pre-contrast myocardium illustrating the error in SASHA T1 values when using a 2-parameter fit with standard CFA readout and a VFA readout, as may be implemented according to some embodiments.
Figure 3B:
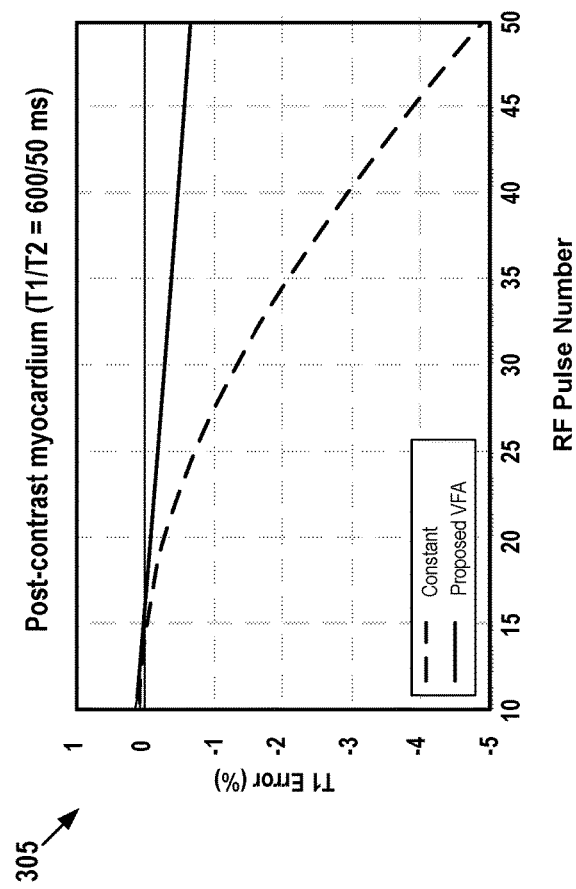
FIG. 3B includes a plot showing the error in post-contrast myocardium illustrating the error in SASHA T1 values when using a 2-parameter fit with standard CFA readout and a VFA readout, as may be implemented according to some embodiments.

FIGS. 3A and 3B illustrate the error in SASHA T1 values when using a 2-parameter fit with standard constant flip angle readout and proposed VFA readout, according to some embodiments. FIG. 3A includes a plot 300 showing the error in pre-contrast myocardium, while FIG. 3B includes a plot 305 showing the error for post-contrast myocardium. For the examples shown in FIGS. 3A and 3B, Bloch equation simulations of the SASHA sequence were performed for typical pre- and post-contrast myocardial T1 values with a classic CFA image readout of 5 linear dummy catalyzation pulses and also with a variable VFA readout, with two-parameter fitting of simulated data to calculate T1. As the number of RF pulses to the center k-space line is increased, T1 error increases for the constant flip angle readout but is kept below 0.8% error for the VFA readout.

Figure 4:
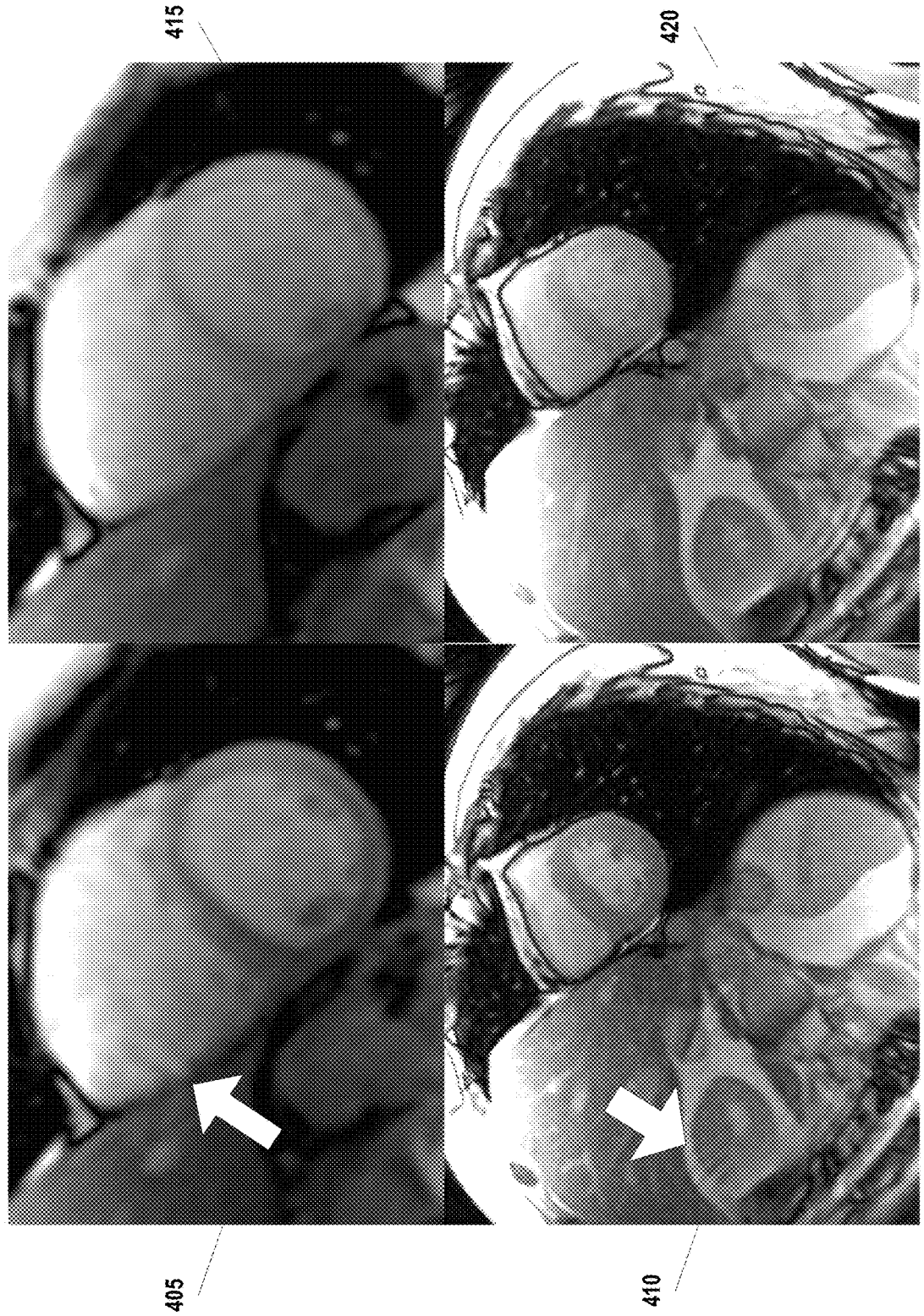
FIG. 4 provides an illustration of raw "non-saturated" SASHA images using a traditional constant flip angle readout and proposed VFA readout, as may be generated using some of the embodiments described herein.

FIG. 4 provides an illustration of raw "non-saturated" SASHA images in two subjects using a traditional constant flip angle readout and proposed VFA readout, as may be generated using some of the embodiments described herein. Images 405 and 410 show the results for constant flip angles. The white arrows added to each image illustrate the presence of artifacts when using a constant flip angle sequence. Images 415 and 420 show the results for the same examples, but with a VFA sequence being applied during readout. Because the VFA readout technique has a smooth ramp up, it mitigates the artifacts shown in images 405 and 410. The mitigation of artifacts may be countered by a loss of contrast in non-saturated images. However, in the saturation recovery images, the VFA readout technique may result in enhanced contrast which, in turn, may benefit motion correction applications.

Figure 5:
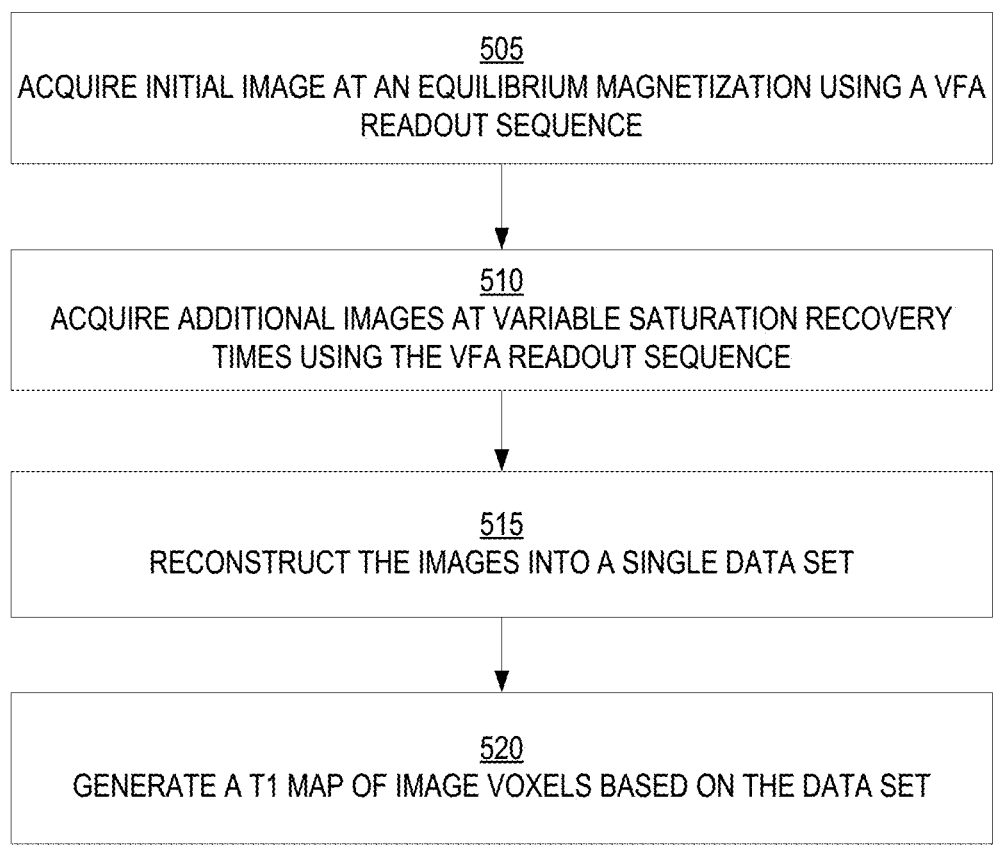
FIG. 5 shows a process where VFA readouts may be used in the generation of T1 maps using techniques such as SASHA, according to some embodiments.

FIG. 5 shows a process 500 where VFA readouts may be used in the generation of T1 maps using techniques such as SASHA, according to some embodiments. At 505, an initial image of an anatomical subject is acquired at an equilibrium magnetization using a VFA readout sequence. Next, at 510, additional images of the anatomical subject are acquired at variable saturation recovery times using the same VFA readout sequence. In some embodiments, all of these images are acquired in a single breath-hold by the subject. Each acquisition may be triggered, for example, using an electrocardiogram signal. The exact type and characteristics of the read out sequence may vary, depending on the implementation. For example, where SASHA is used, a single-shot balanced steady-state free precession (bSSFP) readout sequence may be employed.

Continuing with reference to FIG. 5, at 515, a curve fitting technique is applied to reconstruct the images into a single data set. Various fitting models may be employed. For example, as discussed above, the VFA image readout technique described herein allows a two-parameter T1 fitting model to be used without systematic error. Then, at 520, a T1 map of image voxels is generated based on the data set. Various techniques are known in the art may be applied to generate the T1 map. Graphically, each voxel in the T1 map has a signal intensity representing T1 relaxation time of a corresponding portion of the anatomical subject.

Figure 6:
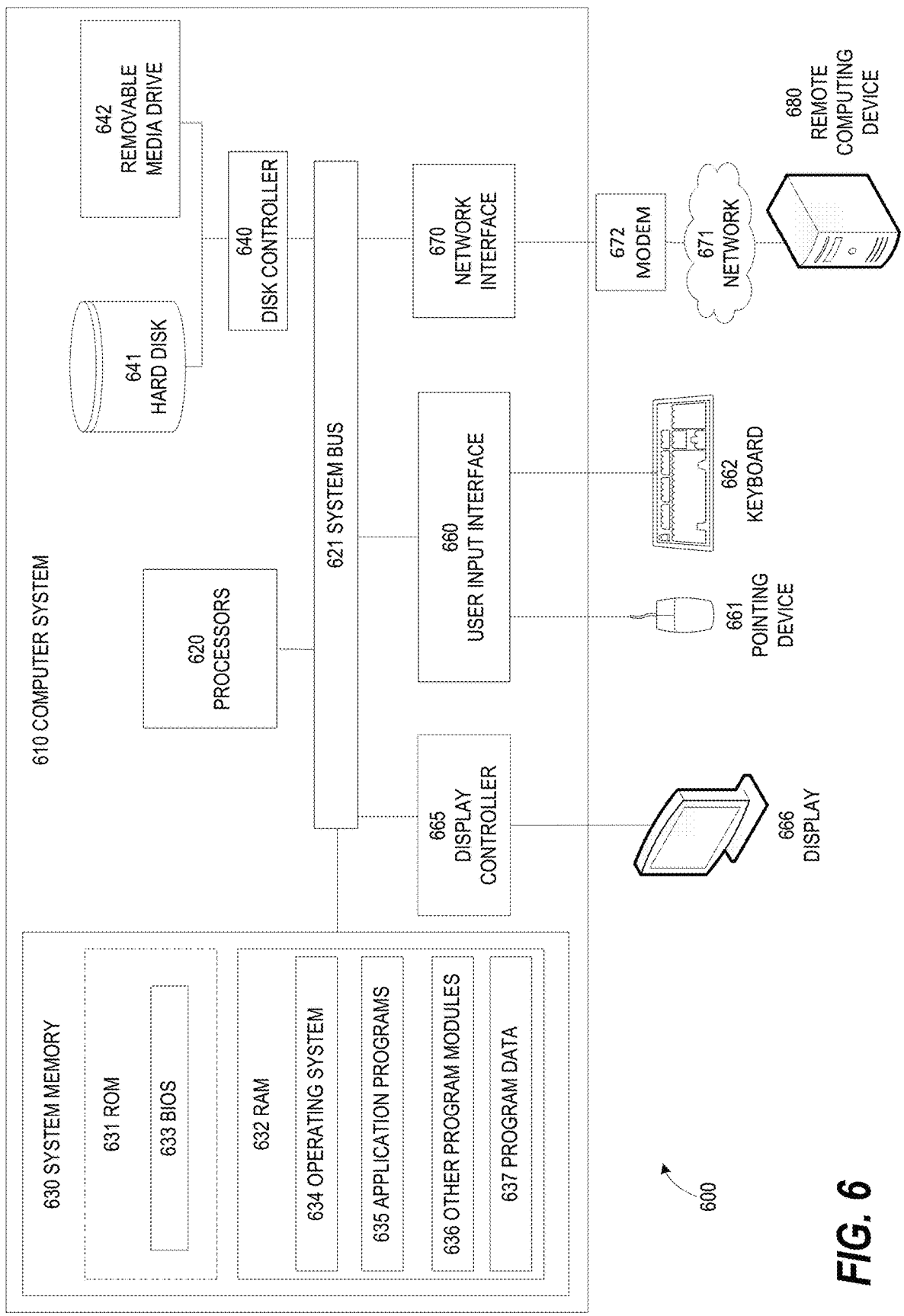
FIG. 6 illustrates an exemplary computing environment 600 within which embodiments may be implemented.

FIG. 6 illustrates an exemplary computing environment 600 within which embodiments may be implemented. For example, computing environment 600 may be used to implement one or more components of system 100 shown in FIG. 1. Computers and computing environments, such as computer system 610 and computing environment 600, are known to those of skill in the art and thus are described briefly here.

As shown in FIG. 6, the computer system 610 may include a communication mechanism such as a system bus 621 or other communication mechanism for communicating information within the computer system 610. The computer system 610 further includes one or more processors 620 coupled with the system bus 621 for processing the information.

The processors 620 may include one or more central processing units (CPUs), graphical processing units (GPUs), or any other processor known in the art. More generally, a processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and be conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

Continuing with reference to FIG. 6, the computer system 610 also includes a system memory 630 coupled to the system bus 621 for storing information and instructions to be executed by processors 620. The system memory 630 may include computer readable storage media in the form of volatile and/or nonvolatile memory, such as read only memory (ROM) 631 and/or random access memory (RAM) 632. The system memory RAM 632 may include other dynamic storage device(s) (e.g., dynamic RAM, static RAM, and synchronous DRAM). The system memory ROM 631 may include other static storage device(s) (e.g., programmable ROM, erasable PROM, and electrically erasable PROM). In addition, the system memory 630 may be used for storing temporary variables or other intermediate information during the execution of instructions by the processors 620. A basic input/output system 633 (BIOS) containing the basic routines that help to transfer information between elements within computer system 610, such as during start-up, may be stored in system memory ROM 631. System memory RAM 632 may contain data and/or program modules that are immediately accessible to and/or presently being operated on by the processors 620. System memory 630 may additionally include, for example, operating system 634, application programs 635, other program modules 636 and program data 637.

The computer system 610 also includes a disk controller 640 coupled to the system bus 621 to control one or more storage devices for storing information and instructions, such as a magnetic hard disk 641 and a removable media drive 642 (e.g., floppy disk drive, compact disc drive, tape drive, and/or solid state drive). The storage devices may be added to the computer system 610 using an appropriate device interface (e.g., a small computer system interface (SCSI), integrated device electronics (IDE), Universal Serial Bus (USB), or FireWire).

The computer system 610 may also include a display controller 665 coupled to the system bus 621 to control a display 666, such as a cathode ray tube (CRT) or liquid crystal display (LCD), for displaying information to a computer user. The computer system includes an input interface 660 and one or more input devices, such as a keyboard 662 and a pointing device 661, for interacting with a computer user and providing information to the one or more processors 620. The pointing device 661, for example, may be a mouse, a light pen, a trackball, or a pointing stick for communicating direction information and command selections to the one or more processors 620 and for controlling cursor movement on the display 666. The display 666 may provide a touch screen interface which allows input to supplement or replace the communication of direction information and command selections by the pointing device 661.

The computer system 610 may perform a portion or all of the processing steps of embodiments of the invention in response to the one or more processors 620 executing one or more sequences of one or more instructions contained in a memory, such as the system memory 630. Such instructions may be read into the system memory 630 from another computer readable medium, such as a magnetic hard disk 641 or a removable media drive 642. The hard disk 641 may contain one or more datastores and data files used by embodiments of the present invention. Datastore contents and data files may be encrypted to improve security. The processors 620 may also be employed in a multi-processing arrangement to execute the one or more sequences of instructions contained in system memory 630. In alternative embodiments, hard-wired circuitry may be used in place of or in combination with software instructions. Thus, embodiments are not limited to any specific combination of hardware circuitry and software.

As stated above, the computer system 610 may include at least one computer readable medium or memory for holding instructions programmed according to embodiments of the invention and for containing data structures, tables, records, or other data described herein. The term "computer readable medium" as used herein refers to any medium that participates in providing instructions to the one or more processors 620 for execution. A computer readable medium may take many forms including, but not limited to, non-transitory, non-volatile media, volatile media, and transmission media. Non-limiting examples of non-volatile media include optical disks, solid state drives, magnetic disks, and magneto-optical disks, such as hard disk 641 or removable media drive 642. Non-limiting examples of volatile media include dynamic memory, such as system memory 630. Non-limiting examples of transmission media include coaxial cables, copper wire, and fiber optics, including the wires that make up the system bus 621. Transmission media may also take the form of acoustic or light waves, such as those generated during radio wave and infrared data communications.

The computing environment 600 may further include the computer system 610 operating in a networked environment using logical connections to one or more remote computers, such as remote computer 680. Remote computer 680 may be a personal computer (laptop or desktop), a mobile device, a server, a router, a network PC, a peer device or other common network node, and typically includes many or all of the elements described above relative to computer system 610. When used in a networking environment, computer system 610 may include modem 672 for establishing communications over a network 671, such as the Internet. Modem 672 may be connected to system bus 621 via user network interface 670, or via another appropriate mechanism.

Network 671 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 610 and other computers (e.g., remote computing 680). The network 671 may be wired, wireless or a combination thereof. Wired connections may be implemented using Ethernet, Universal Serial Bus (USB), RJ-6, or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 671.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

We claim:

1. A method of identifying with a processor of a magnetic resonance imaging (MRI) apparatus, an optimal variable flip angle (VFA) readout sequence configured for parametric mapping using magnetic resonance imaging, wherein the processor of the MRI apparatus performs the method steps comprising:

providing a plurality of candidate VFA readout sequences;

identifying the optimal VFA readout sequence from the plurality of candidate VFA readout sequences over a plurality of first iterations, based on an optimal combination of image characteristics including at least a parametric map error, a signal-to-noise ratio, and a blood-tissue contrast;

during each first iteration, generating a plurality of simulated images for the parametric mapping using a candidate VFA readout sequence, wherein the plurality of simulated images is generated over a plurality of second iterations in a Bloch equation simulation;

during each second iteration, (i) generating a simulated longitudinal magnetization prepared with a parametric contrast using one or more saturation recovery pulses; and (ii) converting the simulated longitudinal magnetization to a simulated image using the candidate VFA readout sequence, wherein the candidate VFA readout sequence comprises a plurality of radio-frequency pulses with corresponding flip-angles varying according to a modulation function; and evaluating image characteristics of the plurality of simulated images generated using the candidate VFA readout sequence, wherein the image characteristics include at least a parametric map error, a signal-to-noise ratio, and a blood-tissue contrast, with the simulated images and the results of the evaluation being provided on a display of the magnetic resonance imaging apparatus.

2. The method of claim 1,
wherein the parametric mapping is T1 mapping, the parametric map error is a T1 error, and the parametric contrast is a T1 contrast.

3. The method of claim 1, wherein the modulation function is a partial sinusoid applied over the candidate VFA readout sequence, and the first n RF pulses in the candidate VFA readout sequence are scaled by sin(x), where x is linearly spaced between π/2n and π/2, and n is a length of the candidate VFA readout sequence.

4. The method of claim 3, wherein in each second iteration, the step of converting the longitudinal magnetization to a simulated image further comprising:
ignoring a predetermined number of initial readouts from the candidate VFA readout sequence, in order to match with linear catalyzation pulses used in a constant flip angle (CFA) readout sequence.

5. The method of claim 2, wherein the T1 error is determined by calculating a T1 relaxation time using a curve fitting technique, and comparing the calculated T1 relaxation time to a predefined T1 relaxation time provided in the Bloch equation simulation.

6. The method of claim 1, wherein in each first iteration, the step of evaluating image characteristics of the plurality of simulated images further comprising:
comparing the image characteristics associated with the candidate VFA readout sequence to the image characteristics associated with a constant flip angle (CFA) readout sequence.

7. The method of claim 1, wherein the signal-to-noise ratio is estimated by a simulated transverse magnetization at a center k-space.

8. The method of claim 1, wherein the blood-tissue contrast is estimated based on a predefined T1 relaxation time and a predefined T2 relaxation time for blood and tissue provided in the Bloch equation simulation.

9. A method of performing parametric mapping using magnetic resonance imaging with a variable flip angle (VFA) readout sequence, the method comprising:
acquiring an initial magnetic resonance image of an anatomical subject at an equilibrium magnetization using a VFA readout sequence on a magnetic resonance imaging (MRI) apparatus including a processor;
acquiring a plurality of additional magnetic resonance images of the anatomical subject at variable rates of saturation recovery using the VFA readout sequence;
applying a curve fitting technique, with the processor, in order to reconstruct the initial magnetic resonance image and the plurality of additional magnetic resonance images into a single data set;

generating a parametric map of voxels, by the processor, based on the single data set, wherein each voxel has a signal intensity representing a parametric value of a corresponding portion of the anatomical subject in the initial magnetic resonance image as well as in the plurality of additional magnetic resonance images; and
providing the generated parametric map of voxels on a display of the MRI apparatus.

10. The method of claim 9, wherein the parametric map is a T1 map, and the parametric value is a T1 relaxation time.

11. The method of claim 10, wherein the curve fitting technique utilizes a two-parameter T1 fitting model.

12. The method of claim 9, wherein the initial magnetic resonance image and the plurality of additional magnetic resonance images are acquired in a single breath-hold.

13. The method of claim 12, wherein acquisition of the initial magnetic resonance image and the plurality of additional magnetic resonance images is triggered using an electrocardiogram signal.

14. The method of claim 13, wherein the VFA readout sequence comprises a single-shot balanced steady-state free precession (bSSFP) readout sequence.

15. The method of claim 9, wherein the VFA readout sequence comprises a plurality of radio-frequency pulses with corresponding flip-angles varying according to a modulation function.

16. The method of claim 9, wherein the VFA readout sequence is sized based on the RF pulse number of a center k-space line.

17. The method of claim 9, further comprising:
discarding a predetermined number of initial readouts from each respective VFA readout sequence during each acquisition, in order to match with linear catalyzation pulses used in a constant flip angle (CFA) readout sequence.

18. A magnetic resonance imaging (MRI) system configured for performing magnetic resonance imaging with a variable flip angle (VFA) readout sequence, the MRI system comprising:
a magnetic resonance imaging device comprising a plurality of coils configured to:
acquire an initial magnetic resonance image of an anatomical subject at an equilibrium magnetization using a VFA readout sequence;
acquire a plurality of additional magnetic resonance images of anatomical subject at variable saturation recovery times using the VFA readout sequence; and
a central control computer unit configured to apply a curve fitting technique, in order to reconstruct the initial magnetic resonance image and the plurality of additional magnetic resonance images into a single data set which is then provided/shown as a result on a display of the MRI system.

19. The system of claim 18, wherein the central control computer unit is further configured to generate a T1 map of voxels based on the single data set, wherein each voxel has a signal intensity representing a T1 relaxation time of a corresponding portion of the anatomical subject.

* * * * *